US009318664B2

(12) United States Patent
Nunotani et al.

(10) Patent No.: US 9,318,664 B2
(45) Date of Patent: Apr. 19, 2016

(54) SEMICONDUCTOR LIGHT EMITTING ELEMENT AND METHOD FOR MANUFACTURING SAME

(75) Inventors: Shinji Nunotani, Fukuoka-ken (JP); Yasuhiko Akaike, Fukuoka-ken (JP); Yoshinori Natsume, Kanagawa-ken (JP); Kazuyoshi Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 13/616,580

(22) Filed: Sep. 14, 2012

(65) Prior Publication Data
US 2013/0240927 A1    Sep. 19, 2013

Related U.S. Application Data

(60) Provisional application No. 61/580,729, filed on Dec. 28, 2011.

(51) Int. Cl.
H01L 33/44    (2010.01)
H01L 33/60    (2010.01)
H01L 33/00    (2010.01)
H01L 33/40    (2010.01)

(52) U.S. Cl.
CPC ............ *H01L 33/44* (2013.01); *H01L 33/0079* (2013.01); *H01L 33/405* (2013.01); *H01L 33/60* (2013.01)

(58) Field of Classification Search
None
See application file for complete search history.

(56) References Cited

U.S. PATENT DOCUMENTS

| 8,110,451 | B2 | 2/2012 | Akaike et al. | |
|---|---|---|---|---|
| 2008/0296627 | A1* | 12/2008 | Watanabe et al. | 257/200 |
| 2009/0278164 | A1 | 11/2009 | Osawa et al. | |
| 2010/0230705 | A1* | 9/2010 | Jeong | 257/98 |
| 2011/0229997 | A1 | 9/2011 | Akaike et al. | |

FOREIGN PATENT DOCUMENTS

| CN | 1960015 A | 5/2007 |
|---|---|---|
| JP | 2001-313436 A | 11/2001 |
| JP | 2007-251112 A | 9/2007 |
| JP | 2009-277852 A | 11/2009 |
| JP | 2011-129621 A | 6/2011 |
| JP | 2013-140941 | 7/2013 |
| TW | 201001638 A | 1/2010 |
| WO | WO 2012/090534 | 7/2012 |

OTHER PUBLICATIONS

Combined Taiwanese Office Action and Search Report issued Apr. 2, 2014 in Patent Application No. 101108452 (with partial English language translation).
Japanese Office Action issued Nov. 27, 2013 in Patent Application No. 2012-195559 with English Translation.
Japanese Office Action issued Jan. 30, 2015, in Japan Patent Application No. 2014-089637 (with English translation).
Office Action issued on Aug. 12, 2015 in Japanese Patent Application No. 2014-089637 with English translation.

* cited by examiner

*Primary Examiner* — Robert Carpenter
(74) *Attorney, Agent, or Firm* — Oblon, McClelland, Maier & Neustadt, L.L.P.

(57) ABSTRACT

According to one embodiment, a semiconductor light emitting element includes: a support substrate; a bonding layer provided on the support substrate; an LED layer provided on the bonding layer; and a buffer layer softer than the bonding layer. The buffer layer is placed in one of between the support substrate and the bonding layer and between the bonding layer and the LED layer.

14 Claims, 10 Drawing Sheets

SEMICONDUCTOR LIGHT EMITTING ELEMENT AND METHOD FOR MANUFACTURING SAME

CROSS-REFERENCE TO RELATED APPLICATIONS

This application is based upon and claims the benefit of priority from the prior U.S. Provisional Patent Application 61/580,729, filed on Dec. 28, 2011; the entire contents of which are incorporated herein by reference.

FIELD

Embodiments described herein relate generally to a semiconductor light emitting element and method for manufacturing same.

BACKGROUND

In manufacturing a thin film LED (light emitting diode), a bonding layer made of e.g. gold alloy is formed on a support substrate. On the other hand, on a crystal growth substrate, an LED layer and a reflection layer are formed, and a bonding layer made of e.g. gold alloy is formed thereon. Then, the bonding layers are bonded to each other to place the LED layer on the support substrate. Subsequently, dicing is performed for division into elements.

However, in this method, the bonding layers after bonding are hardened. Thus, at the time of dicing, peeling may occur at the interface of one of the layers. This decreases the yield of LED.

DETAILED DESCRIPTION

In general, according to one embodiment, a semiconductor light emitting element includes: a support substrate; a bonding layer provided on the support substrate; an LED layer provided on the bonding layer; and a buffer layer softer than the bonding layer. The buffer layer is placed in one of between the support substrate and the bonding layer and between the bonding layer and the LED layer.

Embodiments will now be described with reference to the drawings.

First, a first embodiment of the invention is described.

Figure 1:
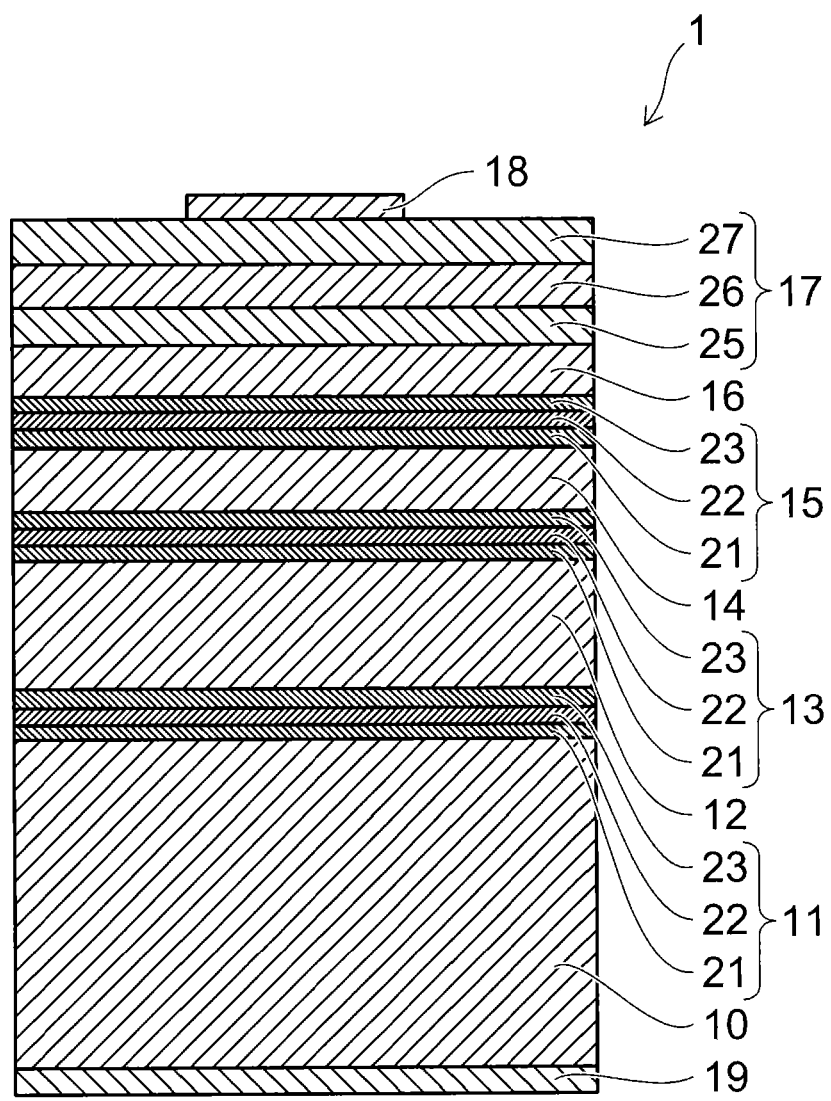
FIG. 1 is a sectional view illustrating a semiconductor light emitting element according to a first embodiment.

FIG. 1 is a sectional view illustrating a semiconductor light emitting element according to this embodiment.

The semiconductor light emitting element according to this embodiment is a thin film LED.

As shown in FIG. 1, the semiconductor light emitting element 1 according to this embodiment includes a support substrate 10 made of e.g. single crystal silicon (Si). On the support substrate 10, a barrier layer 11 is provided. The barrier layer 11 is e.g. a Ti/Pt/Ti three-layer film in which a titanium (Ti) layer 21, a platinum (Pt) layer 22, and a titanium (Ti) layer 23 are stacked in this order.

On the barrier layer 11, a bonding layer 12 is provided. The bonding layer 12 is formed from e.g. gold-indium (Au—In) alloy. The thickness of the bonding layer 12 is e.g. approximately 1-5 μm. On the bonding layer 12, a barrier layer 13 is provided. The barrier layer 13 is a Ti/Pt/Ti three-layer film similar to the barrier layer 11.

On the barrier layer 13, a buffer layer 14 is provided. The buffer layer 14 is softer than the bonding layer 12. For instance, the Young's modulus of the material forming the buffer layer 14 is lower than the Young's modulus of the material forming the bonding layer 12. The buffer layer 14 is formed from a material including gold (Au), such as pure gold. The thickness of the buffer layer 14 is e.g. 0.1-1 μm, such as 0.4 μm.

On the buffer layer 14, a barrier layer 15 is provided. The configuration of the barrier layer 15 is similar to that of the barrier layer 11. On the barrier layer 15, a reflection layer 16 is provided. The reflection layer 16 is made of a material including silver (Ag), such as pure silver. Alternatively, the reflection layer 16 may be formed from aluminum (Al).

On the reflection layer 16, an LED layer 17 is provided. The LED layer 17 is a layer for emitting light under supply of electrical power. In the LED layer 17, sequentially from the support substrate 10 side, a p-type layer 25, a light emitting layer 26, and an n-type layer 27 are stacked. The structure of the LED layer 17 is e.g. a quaternary MQW (multiple quantum well) structure of indium-aluminum-gallium-phosphorus (InAlGaP).

On part of the LED layer 17, an upper electrode layer 18 is provided. On the entire lower surface of the support substrate 10, a lower electrode layer 19 is provided.

The barrier layer 11 is a layer for suppressing reaction between the support substrate 10 and the bonding layer 12. The barrier layer 13 is a layer for suppressing reaction between the bonding layer 12 and the buffer layer 14. The barrier layer 15 is a layer for suppressing reaction between the buffer layer 14 and the reflection layer 16. Here, each barrier layer may be formed from a layer including nickel (Ni). The reflection layer 16 is a layer for causing the light emitted downward from the LED layer 17 to be reflected upward.

Next, a method for manufacturing a semiconductor light emitting element according to this embodiment is described.

FIGS. 2A to 2C, FIGS. 3A and 3B, and FIG. 4 are process sectional views illustrating the method for manufacturing a semiconductor light emitting element according to this embodiment.

Figure 2A:
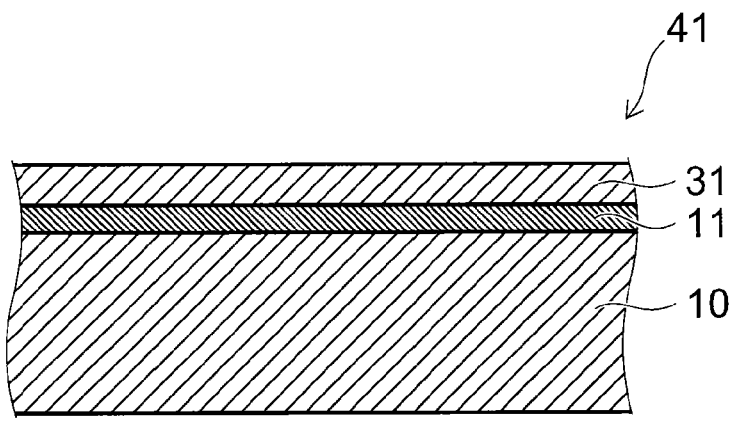
FIGS. 2A to 2C, FIGS. 3A and 3B, and FIG. 4 are process sectional views illustrating the method for manufacturing a semiconductor light emitting element according to the first embodiment.

First, as shown in FIG. 2A, a support substrate 10 is prepared. As the support substrate 10, for instance, a silicon wafer is used. Then, on the support substrate 10, a titanium layer 21 (see FIG. 1), a platinum layer 22 (see FIG. 1), and a titanium layer 23 (see FIG. 1) are deposited in this order to form a barrier layer 11. Next, a material including gold, such as pure gold, is deposited to form a bonding layer 31 on the barrier layer 11. The thickness of the bonding layer 31 is set to approximately half the thickness of the bonding layer 12 (see FIG. 1) in the completed semiconductor light emitting element 1. Thus, a support member 41 with the barrier layer 11 and the bonding layer 31 stacked on the support substrate 10 is fabricated.

Figure 2B:
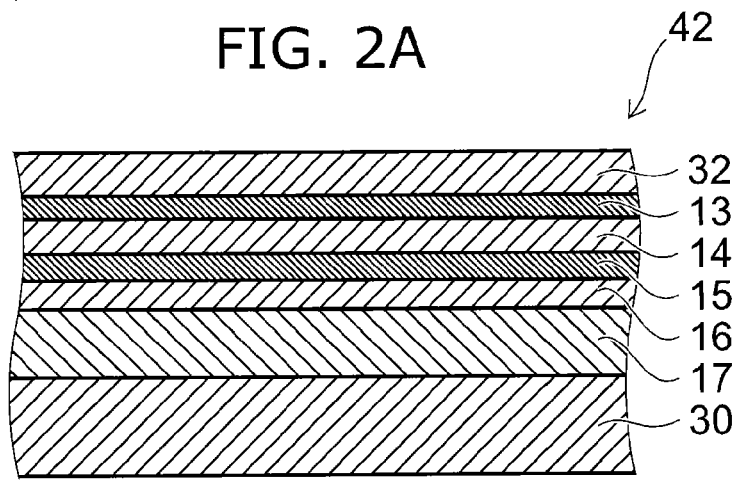

On the other hand, as shown in FIG. 2B, a crystal growth substrate 30 is prepared. As the crystal growth substrate 30, for instance, a single crystal gallium arsenide (GaAs) substrate is used. Then, on the crystal growth substrate 30, an n-type layer 27 (see FIG. 1), a light emitting layer 26 (see FIG. 1), and a p-type layer 25 (see FIG. 1) are epitaxially grown in this order to form an LED layer 17.

Next, silver, for instance, is deposited to form a reflection layer 16 on the LED layer 17. Next, titanium, platinum, and titanium are deposited in this order to form a barrier layer 15. Next, a material including gold, such as pure gold, is deposited to form a buffer layer 14 on the barrier layer 15. Next, a barrier layer 13 is formed on the buffer layer 14. Next, a material including gold, such as pure gold, is deposited to form a bonding layer 32 on the barrier layer 13. The thickness of the bonding layer 32 is set to approximately half the thickness of the bonding layer 12 (see FIG. 1) in the completed semiconductor light emitting element 1. Thus, an LED member 42 with the LED layer 17, the reflection layer 16, the barrier layer 15, the buffer layer 14, the barrier layer 13, and the bonding layer 32 stacked in this order on the crystal growth substrate 30 is fabricated.

Figure 2C:
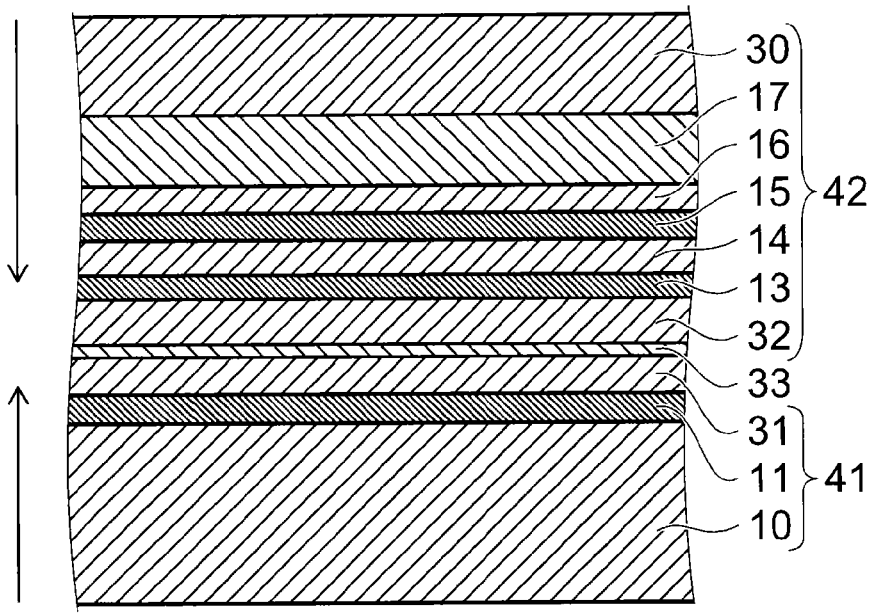

Next, as shown in FIG. 2C, on at least one of the bonding layer 31 and the bonding layer 32, an indium layer 33 is formed. Then, the bonding layer 31 of the support member 41 and the bonding layer 32 of the LED member 42 are brought into abutment via the indium layer 33 to stack the support member 41 and the LED member 42. At this stage, numerous voids (not shown) exist between the bonding layer 31 and the bonding layer 32.

Figure 3A:
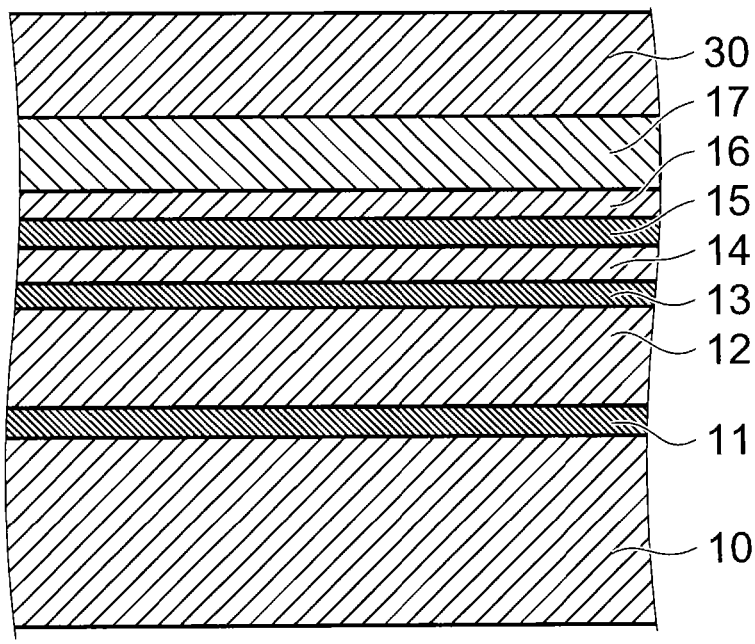

Next, as shown in FIG. 3A, heat treatment is performed to melt the indium layer 33. Thus, the indium layer 33 is turned to liquid phase and fills the voids. Furthermore, indium atoms constituting the indium layer 33 diffuse into the bonding layer 31 and the bonding layer 32 and react with gold atoms constituting the bonding layers 31 and 32 to form a gold-indium alloy. Thus, the bonding layer 31 and the bonding layer 32 are bonded via the indium layer 33 to constitute one bonding layer 12 made of gold-indium (Au—In) alloy. In this process, the bonding layers 31 and 32 made of pure gold are turned to the bonding layer 12 made of gold-indium alloy. Thus, the bonding layer 12 is hardened, and its viscosity is decreased.

However, at this time, indium atoms diffused into the bonding layer 32 are blocked from diffusion by the barrier layer 13. This prevents the indium atoms from penetrating into the buffer layer 14 and reacting with gold constituting the buffer layer 14. Thus, the composition of the buffer layer 14 remains pure gold. Hence, the buffer layer 14 is softer than the bonding layers 31 and 32 after bonding, i.e., the bonding layer 12 made of gold-indium alloy.

Figure 3B:
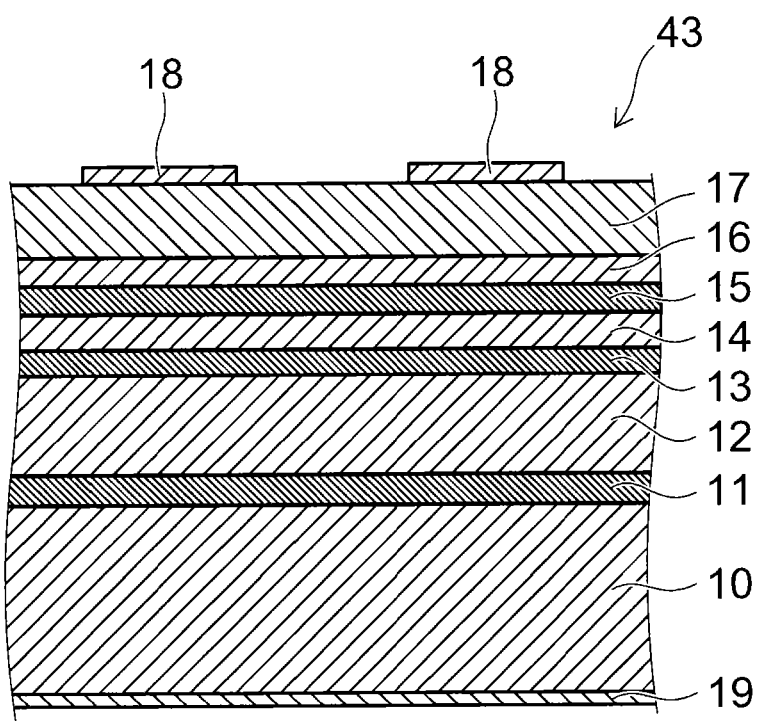

Next, as shown in FIG. 3B, the crystal growth substrate 30 (see FIG. 3A) is removed. Next, on part of the surface of the LED layer 17 having been in contact with the crystal growth substrate 30, an upper electrode layer 18 is formed. Furthermore, on the entire lower surface of the support substrate 10, a lower electrode layer 19 is formed. Next, sintering treatment is performed. That is, by heat treatment, the upper electrode layer 18 is brought into ohmic contact with the LED layer 17, and the lower electrode layer 19 is brought into ohmic contact with the support substrate 10.

Figure 4:
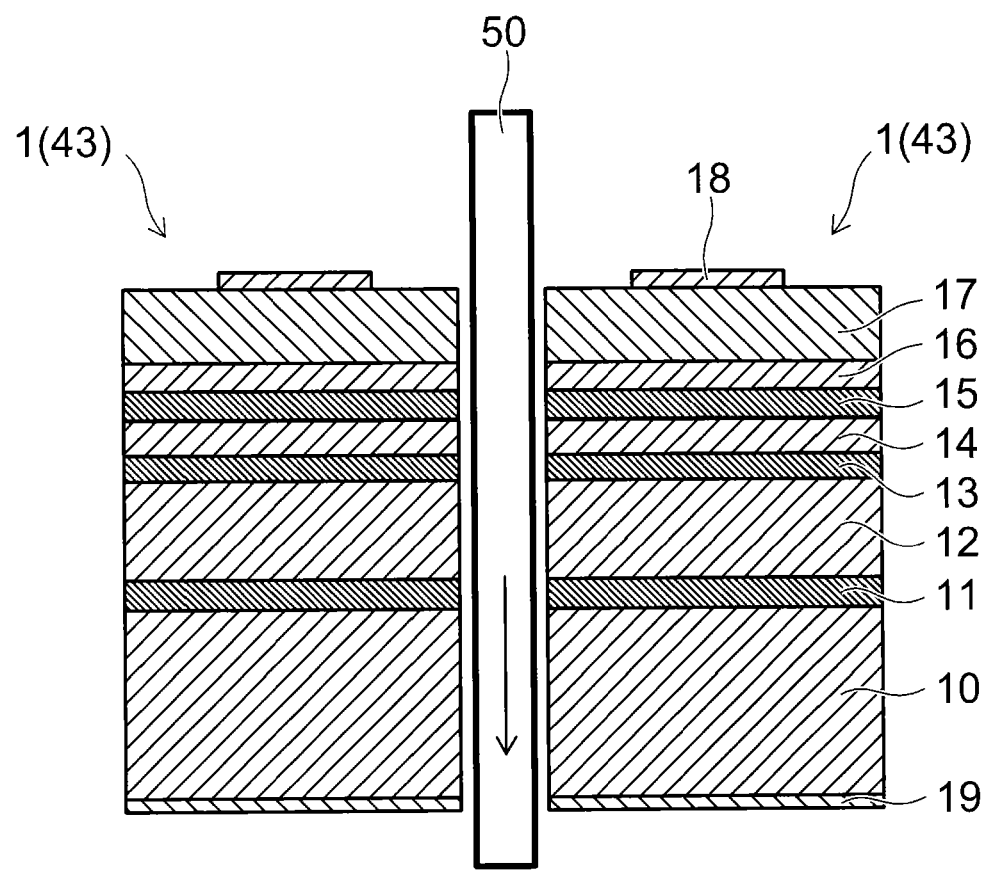

Next, as shown in FIG. 4, the stacked body fabricated as described above, i.e., the stacked body 43 made of the lower electrode layer 19, the support substrate 10, the barrier layer 11, the bonding layer 12, the barrier layer 13, the buffer layer 14, the barrier layer 15, the reflection layer 16, the LED layer 17, and the upper electrode layer 18 is diced with a blade 50. The blade 50 is shaped like e.g. a disk, and locally removes the stacked body 43 by rotation. As a result, the stacked body 43 is divided into a plurality of semiconductor light emitting elements 1. Thus, the semiconductor light emitting element 1 is manufactured.

Next, the operation and effect of this embodiment are described.

In the step shown in FIG. 2C, when the LED member 42 is placed on the support member 41, numerous voids occur between the bonding layer 31 and the bonding layer 32. At this time, it may be considered that without providing the indium layer 33, the bonding layer 31 and the bonding layer 32 made of gold could be directly brought into abutment. However, in this case, because gold has low fluidity, even with the heat treatment shown in FIG. 3A, the voids are not eliminated but left in the bonding layer 12. This decreases the bonding strength.

Thus, in this embodiment, the bonding layer 31 and the bonding layer 32 are brought into abutment via the indium layer 33, and then heated. Accordingly, the indium layer 33 is turned into liquid and flows to fill the voids. That is, the bonding layer 31 and the bonding layer 32 can be robustly bonded by liquid phase diffusion bonding. However, the bonding layer 12 is then turned to a gold-indium alloy and hardened.

In this embodiment, between the bonding layer 12 and the reflection layer 16, a buffer layer 14 being softer and having higher viscosity than the bonding layer 12 is placed. Thus, in the dicing step shown in FIG. 4, the buffer layer 14 can relax the mechanical stress and impact applied to the stacked body 43. As a result, in the dicing step, peeling at the interface of any layer in the stacked body 43 can be suppressed. Thus, the semiconductor light emitting element 1 can be manufactured with high yield, and the cost can be kept low. In particular, by forming the buffer layer 14 from gold, a buffer layer being particularly soft, having high conductivity, and being resistant to corrosion can be realized.

Furthermore, in this embodiment, a barrier layer 13 is provided between the bonding layer 12 and the buffer layer 14. Thus, both in the bonding shown in FIG. 3A and in the sintering treatment shown in FIG. 3B, entry of indium atoms diffusing in the bonding layer 12 into the buffer layer 14 can be suppressed. Hence, the buffer layer 14 can be kept in the soft state of pure gold. Furthermore, a barrier layer 11 is provided between the support substrate 10 and the bonding layer 12, and a barrier layer 15 is provided between the buffer layer 14 and the reflection layer 16. Thus, reactions between these substrate and layers can also be suppressed.

Next, a second embodiment is described.

Figure 5:
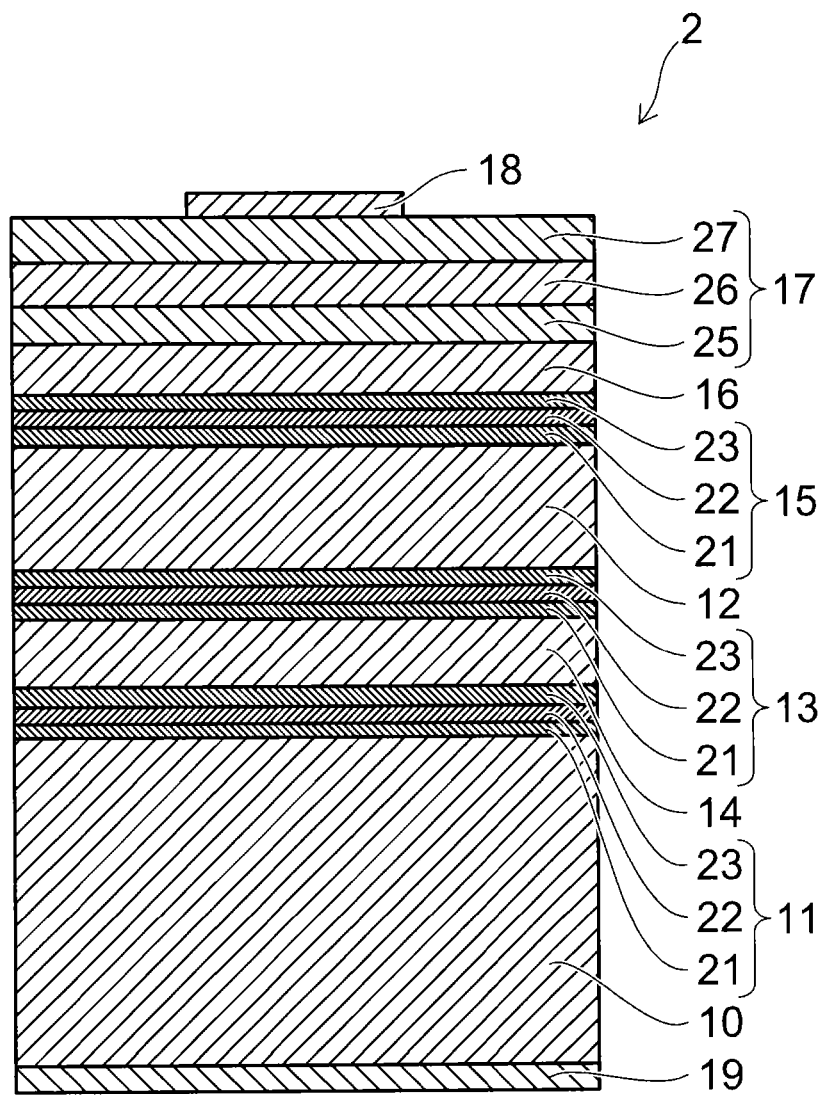
FIG. 5 is a sectional view illustrating a semiconductor light emitting element according to a second embodiment.

FIG. 5 is a sectional view illustrating a semiconductor light emitting element according to this embodiment.

As shown in FIG. 5, the semiconductor light emitting element 2 according to this embodiment is different from the semiconductor light emitting element 1 (see FIG. 1) according to the above first embodiment in that the arrangement of the bonding layer 12 and the buffer layer 14 is reversed. That is, on the support substrate 10, a barrier layer 11, a buffer layer 14, a barrier layer 13, a bonding layer 12, a barrier layer 15, a reflection layer 16, and an LED layer 17 are stacked in this order.

Figure 6A:
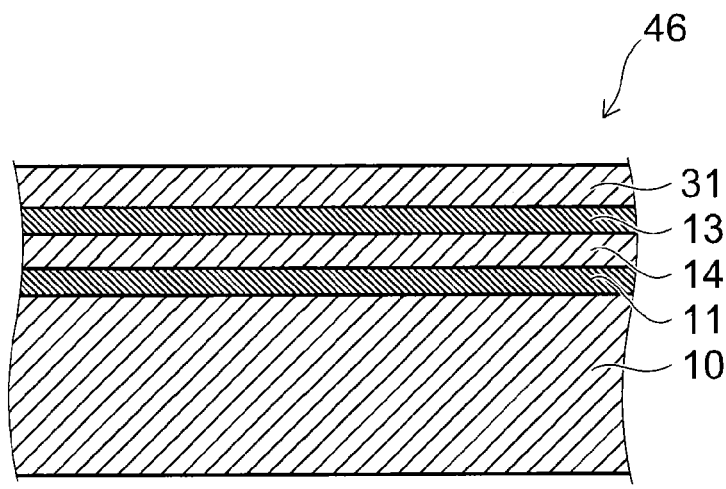
FIGS. 6A to 6C are process sectional views illustrating the method for manufacturing a semiconductor light emitting element according to the second embodiment.
Figure 6B:
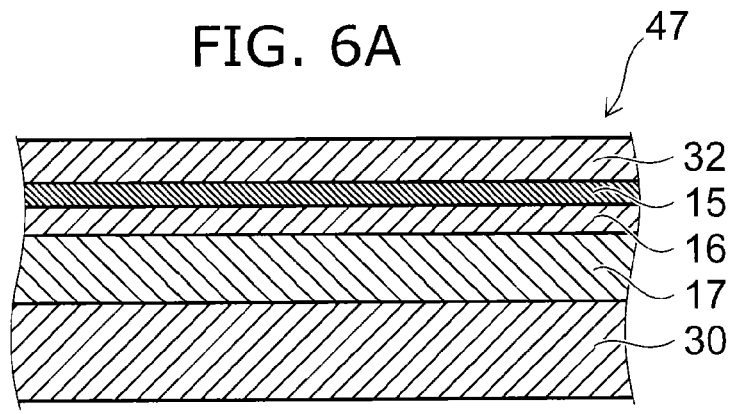
Figure 6C:
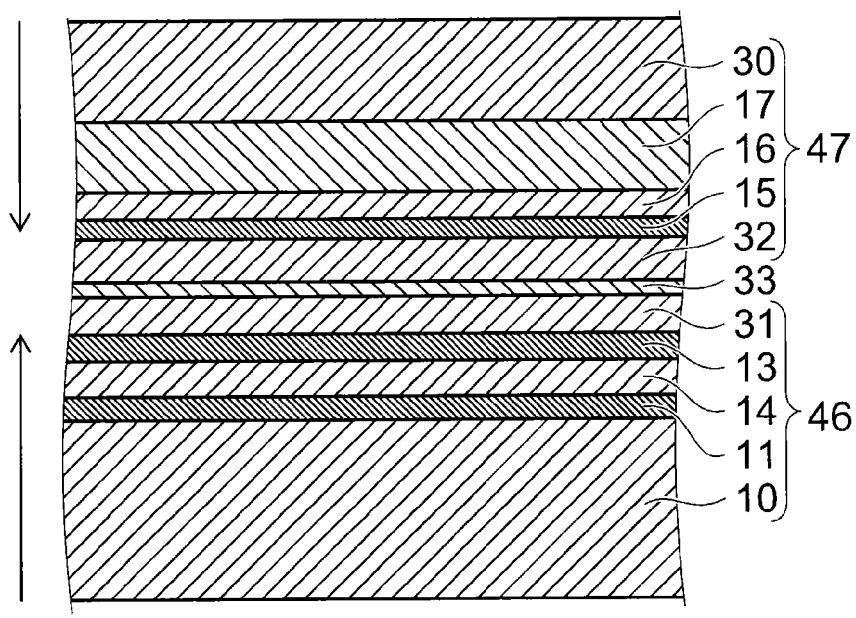

FIGS. 6A to 6C are process sectional views illustrating a method for manufacturing a semiconductor light emitting element according to this embodiment.

First, as shown in FIG. 6A, on the support substrate 10, titanium, platinum, and titanium are deposited in this order to form a barrier layer 11. Next, a material including gold, such as pure gold, is deposited to form a buffer layer 14 on the barrier layer 11. Next, a barrier layer 13 is formed on the buffer layer 14. Next, a material including gold, such as pure gold, is deposited to form a bonding layer 31 on the barrier layer 13. Thus, a support member 46 with the barrier layer 11, the buffer layer 14, the barrier layer 13, and the bonding layer 31 stacked on the support substrate 10 is fabricated.

On the other hand, as shown in FIG. 6B, on the crystal growth substrate 30, an LED layer 17 is formed. Next, silver, for instance, is deposited to form a reflection layer 16 on the LED layer 17. Next, a barrier layer 15 is formed on the reflection layer 16. Next, a material including gold, such as pure gold, is deposited to form a bonding layer 32 on the barrier layer 15. Thus, an LED member 47 with the LED layer 17, the reflection layer 16, the barrier layer 15, and the bonding layer 32 stacked in this order on the crystal growth substrate 30 is fabricated.

The subsequent manufacturing method is similar to that of the above first embodiment. More specifically, the bonding layer 31 and the bonding layer 32 are brought into abutment via an indium layer 33. Next, gold included in the bonding layer 31 and the bonding layer 32 is reacted with indium included in the indium layer 33 to bond the bonding layer 31 and the bonding layer 32. Thus, a bonding layer 12 made of gold-indium alloy is formed. Next, the crystal growth substrate 30 is removed. Next, an upper electrode layer 18 is formed on the LED layer 17, and a lower electrode layer 19 is formed on the lower surface of the support substrate 10. Next, by heat treatment, the upper electrode layer 18 is brought into ohmic contact with the LED layer 17, and the lower electrode layer 19 is brought into ohmic contact with the support substrate 10. Then, the stacked body made of the support substrate 10, the barrier layer 11, the buffer layer 14, the barrier layer 13, the bonding layer 12, the barrier layer 15, the reflection layer 16, and the LED layer 17 is divided by dicing. Thus, the semiconductor light emitting element 2 according to this embodiment is manufactured.

This embodiment can also achieve similar effects to those of the above first embodiment. The configuration, manufacturing method, and operation and effect of this embodiment other than the foregoing are similar to those of the above first embodiment.

Next, a third embodiment is described.

Figure 7:
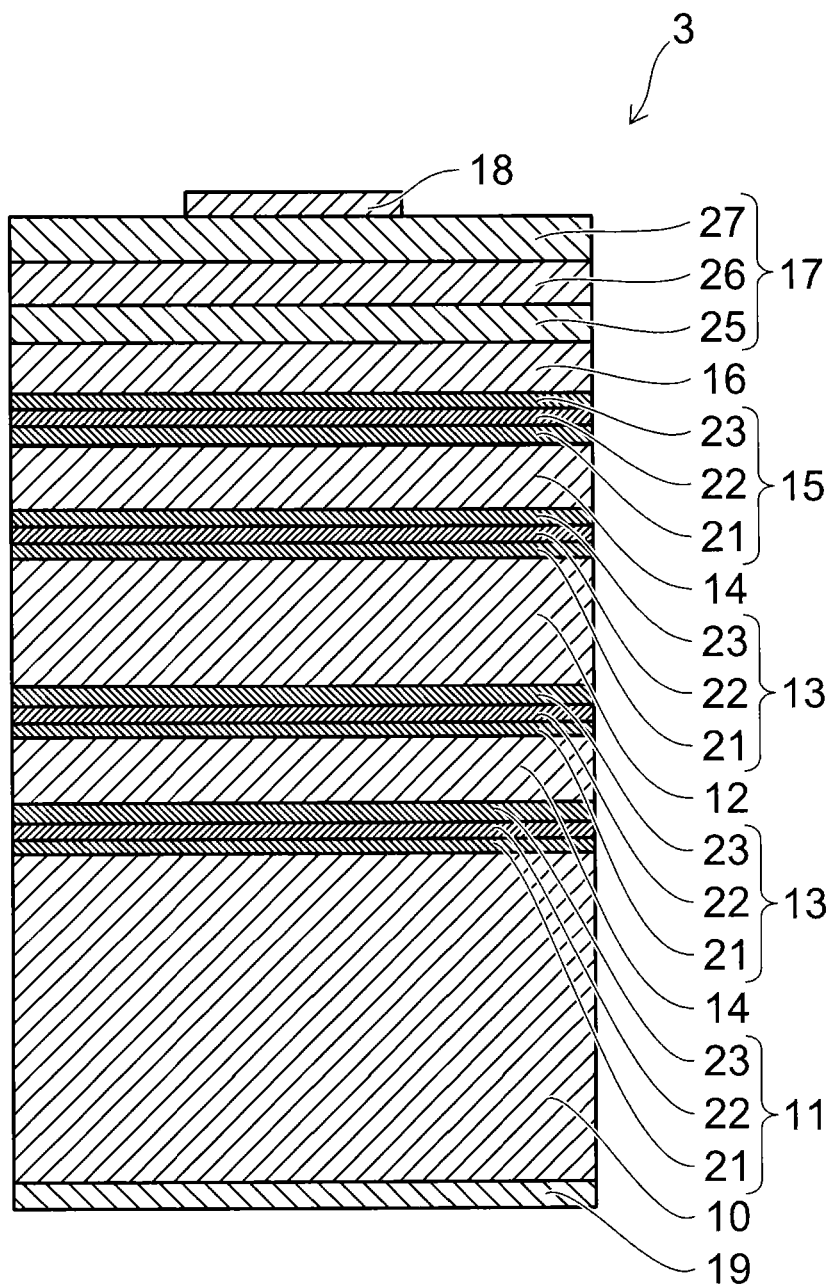
FIG. 7 is a sectional view illustrating a semiconductor light emitting element according to a third embodiment.

FIG. 7 is a sectional view illustrating a semiconductor light emitting element according to this embodiment.

As shown in FIG. 7, in the semiconductor light emitting element 3 according to this embodiment, the buffer layer 14 is provided in two layers. The buffer layers 14 are placed between the support substrate 10 and the bonding layer 12, and between the bonding layer 12 and the reflection layer 16. Furthermore, the barrier layer 13 is also provided in two layers. The barrier layer 13 is provided between each buffer layer 14 and the bonding layer 12. That is, on the support substrate 10, a barrier layer 11, a buffer layer 14, a barrier layer 13, a bonding layer 12, a barrier layer 13, a buffer layer 14, a barrier layer 15, a reflection layer 16, and an LED layer 17 are stacked in this order.

This semiconductor light emitting element 3 can be manufactured as follows. The support member 46 shown in FIG. 6A and the LED member 42 shown in FIG. 2B are fabricated and bonded via an indium layer 33. Subsequently, an upper electrode layer 18 and a lower electrode layer 19 are formed. Then, dicing is performed.

According to this embodiment, two buffer layers 14 are provided on both sides of the bonding layer 12. Thus, interlayer peeling at the time of dicing can be reliably prevented.

The configuration, manufacturing method, and operation and effect of this embodiment other than the foregoing are similar to those of the above first embodiment.

Next, a fourth embodiment will be described.

Figure 8:
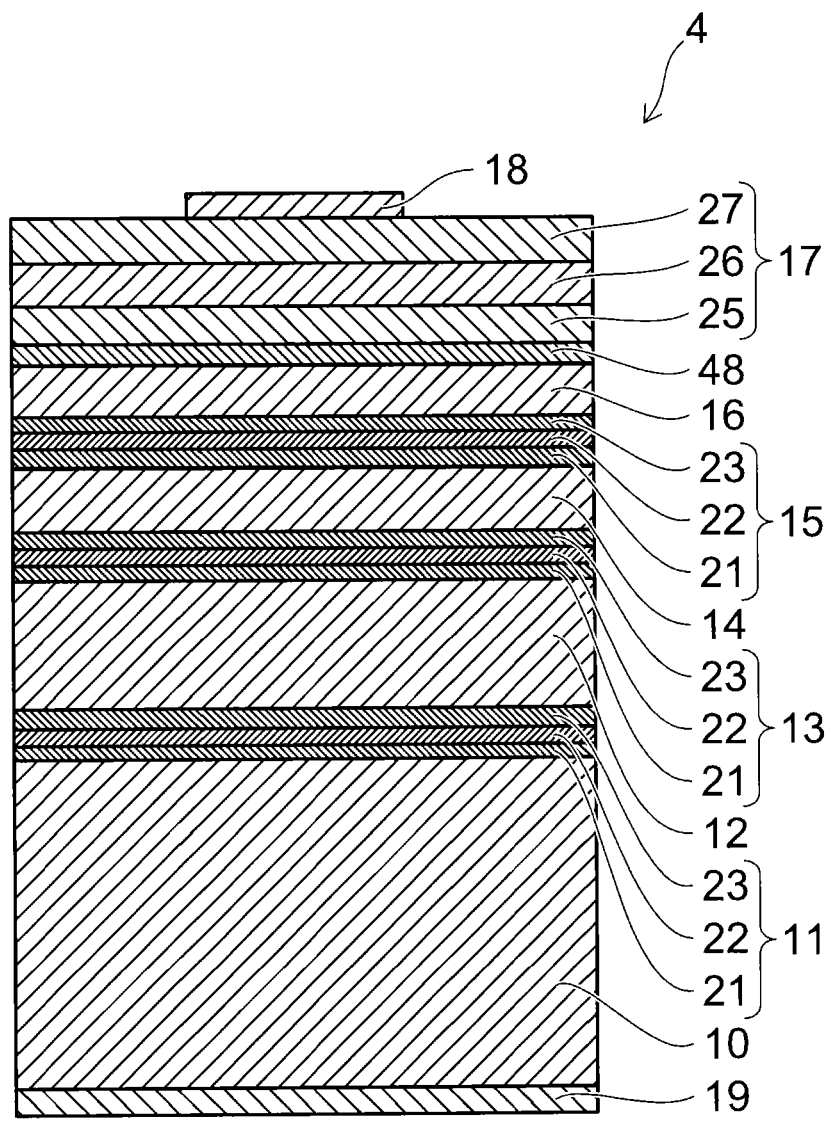
FIG. 8 is a sectional view illustrating a semiconductor light emitting element according to a fourth embodiment.

FIG. 8 is a sectional view illustrating a semiconductor light emitting element according to the embodiment.

As shown in FIG. 8, in the semiconductor light emitting element 4 according to the embodiment, a conductive alloying suppression layer 48 is provided between the reflection layer 16 and the LED layer 17 in addition to the configuration of the semiconductor light emitting element 1 (see FIG. 1) according to the above first embodiment. The conductive alloying suppression layer 48 does not react to form an alloy between the reflection layer 16 and the LED layer 17, and has a structure assuring an electrical conduction and preferably transmit the light. The conductive alloying suppression layer 48 can be based on, for example, an ITO (Indium-Tin-Oxide) layer.

In the embodiment, the conductive alloying suppression layer 48 is provided, this can prevent formation of the alloying reaction layer between the reaction layer 16 and the LED layer 17 and reduction of the reflection efficiency due to conversion of this alloying reaction layer to a light absorption layer.

The configuration, manufacturing method, and operation and effect of this embodiment other than the foregoing are similar to those of the above first embodiment.

Next, a fifth embodiment will be described.

Figure 9:
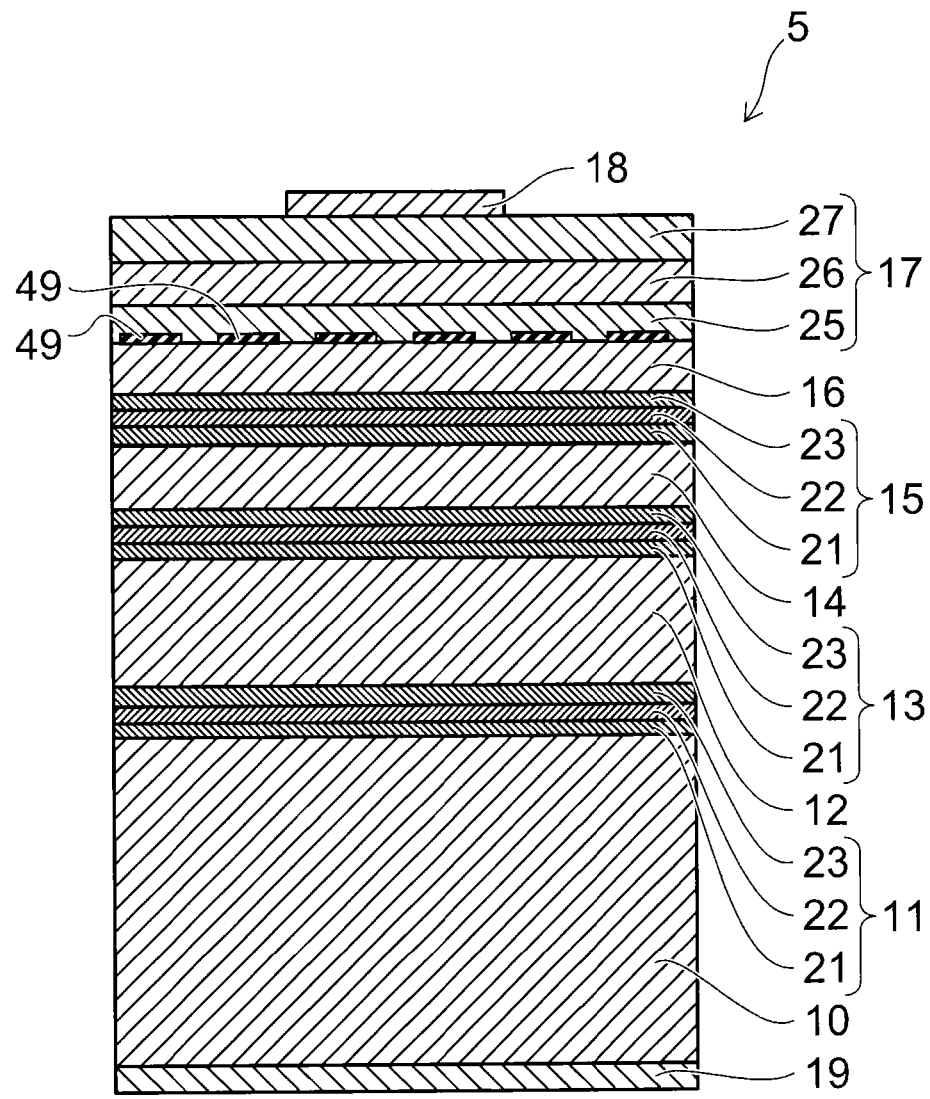
FIG. 9 is a sectional view illustrating a semiconductor light emitting element according to a fifth embodiment.

FIG. 9 is a sectional view illustrating a semiconductor light emitting element according to the embodiment.

As shown in FIG. 9, in the semiconductor light emitting element 5 according to the embodiment, a current narrowing layer 49 is provided between the reflection layer 16 and the LED layer in addition to the configuration of the semiconductor light emitting element (see FIG. 1) according to the above first embodiment. The current narrowing layer 49 is an insulating layer selectively placed in an arbitrary pattern on the current path of the current supplied to the LED layer 17, for example, can be based on an electrically insulating layer made of a silicon oxide layer or silicon nitride layer and the like.

In the embodiment, a current density of the current supplied to the LED layer 17 can be adjusted by providing the current narrowing layer 49.

The configuration, manufacturing method, and operation and effect of this embodiment other than the foregoing are similar to those of the above first embodiment.

The position of the current narrowing layer is not limited to a position between the reflection layer 16 and the LED layer 17, and may be a position intervening on the current path of the current supplied to the LED layer 17. Both the conductive alloying suppression layer 48 (see FIG. 8) of the above fourth embodiment and the current narrowing layer 49 of the embodiment may be provided.

In the above embodiments, the bonding layers 31 and 32 are formed from gold and bonded via an indium layer 33. Thus, the bonding layer 12 is formed from gold-indium alloy. On the other hand, the buffer layer 14 is formed from gold.

However, the embodiments are not limited thereto. The buffer layer 14 achieves the effect of relaxing the stress associated with dicing as long as it is softer than the bonding layer 12 after bonding.

Next, a comparative example is described.

Figure 10:
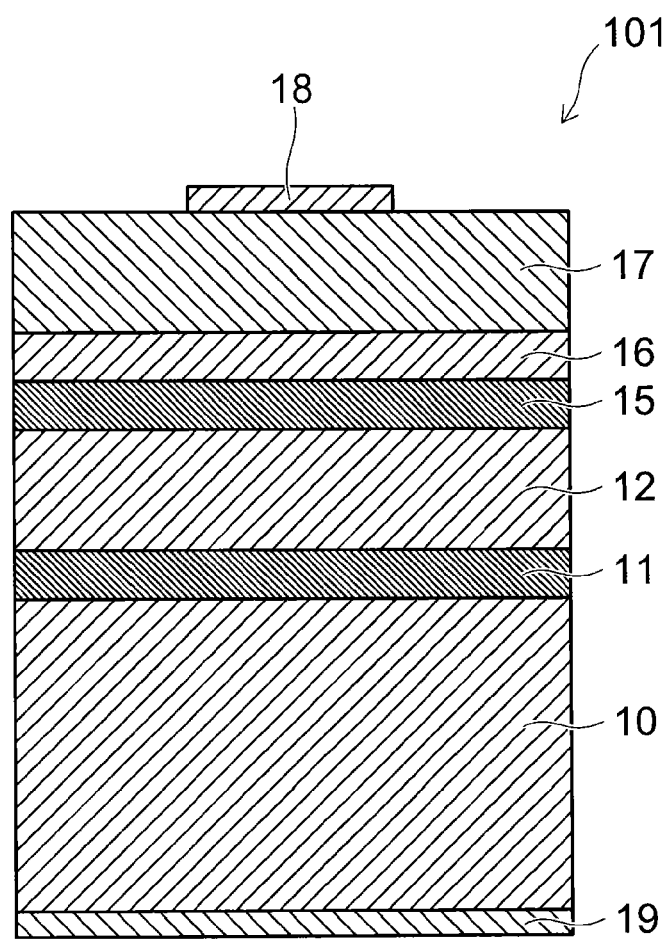
FIG. 10 is a sectional view illustrating a semiconductor light emitting element according to a comparative example.

FIG. 10 is a sectional view illustrating a semiconductor light emitting element according to this comparative example.

Figure 11:
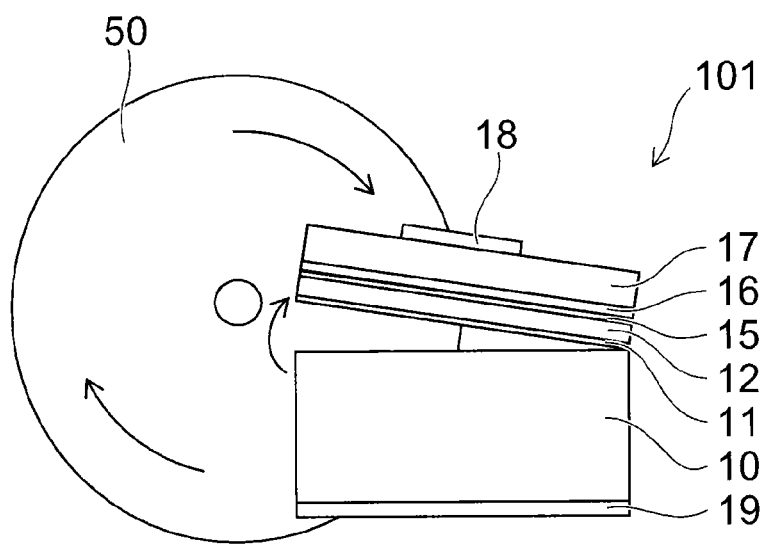
FIG. 11 illustrates a method for manufacturing a semiconductor light emitting element according to the comparative example.

FIG. 11 illustrates a method for manufacturing a semiconductor light emitting element according to this comparative example.

As shown in FIG. 10, the semiconductor light emitting element 101 according to this comparative example does not include the buffer layer 14 (see FIG. 1). Furthermore, the barrier layer 13 (see FIG. 1) between the bonding layer 12 and the buffer layer 14 is also not provided.

As shown in FIG. 11, in manufacturing such a semiconductor light emitting element 101, in the dicing step, peeling often occurs at one of the interfaces. In particular, peeling frequently occurs at the interface with low degree of contact, such as the interface between the support substrate 10 and the barrier layer 11, and the interface between the barrier layer 15 and the reflection layer 16, which are semiconductor-metal interfaces. The reason for this is considered as follows. Because the buffer layer 14 is not provided, the mechanical stress associated with dicing is not relaxed. The stress concentrates on the weakest portion in the stacked body. As a result, the semiconductor light emitting element 101 has low yield, and the manufacturing cost is increased.

The embodiments described above can realize a semiconductor light emitting element and a method for manufacturing the same in which peeling is less likely to occur in the dicing step.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element comprising:
a support substrate;
a first metal layer provided on the support substrate;
a bonding layer provided on the first metal layer, the bonding layer consisting of an alloy containing a first component and a second component;
a second metal layer provided on the bonding layer;
an LED layer provided on the second metal layer; and
a buffer layer containing the first component, the buffer layer being softer than the bonding layer,
each of the first metal layer and the second metal layer including:
a layer containing titanium, and
a layer containing platinum; and
the buffer layer being placed in one of between the support substrate and the first metal layer and between the second metal layer and the LED layer.

2. The element according to claim 1, further comprising another buffer layer placed in the other of between the support substrate and the first metal layer and between the second metal layer and the LED layer, and the another buffer layer being softer than the bonding layer.

3. The element according to claim 1, further comprising a reflection layer placed between the LED layer and the buffer layer and between the LED layer and the bonding layer.

4. The element according to claim 3, wherein the reflection layer contains silver.

5. The element according to claim 3, further comprising a conductive alloying suppression layer provided between the reflection layer and the LED layer, not reacting to form an alloy between the reflection layer and the LED layer, and being conductive.

6. The element according to claim 1, further comprising an insulating current narrowing layer selectively placed on a current path of a current supplied to the LED layer.

7. The element according to claim 1, wherein
the first component is gold, and
the second component is indium.

8. A semiconductor light emitting element comprising:
a support substrate;
a first metal layer provided on the support substrate;
a bonding layer provided on the first metal layer, the bonding layer consisting of an alloy containing a first component and a second component;
a second metal layer provided on the bonding layer;
an LED layer provided on the second metal layer; and
a buffer layer containing the first component, the buffer layer being softer than the bonding layer,
each of the first metal layer and the second metal layer including:
a layer containing titanium; and
a layer containing platinum,
the buffer layer being placed in one of between the first metal layer and the bonding layer and between the bonding layer and the second metal layer.

9. The element according to claim 8, further comprising another buffer layer placed in the other of between the first metal layer and the bonding layer and between the bonding layer and the second metal layer, and the another buffer layer being softer than the bonding layer.

10. The element according to claim 8, further comprising a reflection layer placed between the LED layer and the buffer layer and between the LED layer and the bonding layer.

11. The element according to claim 10, wherein the reflection layer contains silver.

12. The element according to claim 10, further comprising a conductive alloying suppression layer provided between the reflection layer and the LED layer, not reacting to form an alloy between the reflection layer and the LED layer, and being conductive.

13. The element according to claim 8, further comprising an insulating current narrowing layer selectively placed on a current path of a current supplied to the LED layer.

14. The element according to claim 8, wherein
the first component is gold, and
the second component is indium.

\* \* \* \* \*